United States Patent
Dumas et al.

(10) Patent No.: US 8,546,186 B2
(45) Date of Patent: *Oct. 1, 2013

(54) PLANAR INTERCONNECT STRUCTURE FOR HYBRID CIRCUITS

(75) Inventors: Craig Dumas, Mayer, MN (US); Vijaykumar Sundermurthy, Eden Prairie, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/435,548

(22) Filed: Mar. 30, 2012

(65) Prior Publication Data

US 2013/0005084 A1 Jan. 3, 2013

Related U.S. Application Data

(60) Continuation of application No. 12/563,752, filed on Sep. 21, 2009, now Pat. No. 8,148,201, which is a division of application No. 11/743,644, filed on May 2, 2007, now abandoned.

(51) Int. Cl.
*H01L 21/00* (2006.01)

(52) U.S. Cl.
USPC ............ 438/107; 438/618; 257/E25.03

(58) Field of Classification Search
USPC ............ 438/107, 618; 257/E25.03
See application file for complete search history.

(56) References Cited

U.S. PATENT DOCUMENTS

| | | | |
|---|---|---|---|
| 4,604,678 A | 8/1986 | Hagner | |
| 5,013,249 A | 5/1991 | Lindeman et al. | |
| 5,091,339 A | 2/1992 | Carey | |
| 5,130,894 A | 7/1992 | Miller | |
| 5,147,207 A | 9/1992 | Mowry | |
| 5,231,304 A | 7/1993 | Solomon | |
| 5,426,563 A | 6/1995 | Moresco et al. | |
| 5,825,631 A | 10/1998 | Prchal | |
| 7,196,866 B2 | 3/2007 | Poorman et al. | |
| 8,148,201 B2 | 4/2012 | Dumas et al. | |
| 2007/0052503 A1 | 3/2007 | van Quach et al. | |
| 2007/0102828 A1 | 5/2007 | Wenzel et al. | |
| 2007/0231964 A1 | 10/2007 | Lee et al. | |
| 2008/0272496 A1 | 11/2008 | Dumas et al. | |
| 2010/0009498 A1 | 1/2010 | Dumas et al. | |

OTHER PUBLICATIONS

U.S. Appl. No. 11/473,644, Non-Final Office Action mailed Oct. 31, 2008, 15 pgs.
U.S. Appl. No. 11/743,644, Final Office Action mailed May 21, 2009, 13 pgs.
U.S. Appl. No. 11/743,644, Response filed Aug. 21, 2009 to Final Office Action mailed May 21, 2009, 9 pgs.
U.S. Appl. No. 11/743,644, Response filed Feb. 2, 2009 to Non Final Office Action mailed Oct. 31, 2008, 9 pages.
U.S. Appl. No. 12/563,752 , Response filed Nov. 1, 2011 to Final Office Action mailed Sep. 1, 2011, 6 pgs.
U.S. Appl. No. 12/563,752, Final Office Action mailed Sep. 1, 2011, 10 pgs.

(Continued)

*Primary Examiner* — Marvin Payen
(74) *Attorney, Agent, or Firm* — Schwegman, Lundberg & Woessner, P.A.

(57) ABSTRACT

Described herein is an electronic device in which one or more planar interconnect structure are interposed between two substrates each incorporating a hybrid circuit. The planar interconnect structure has a plurality of conductive traces formed on one of its faces for electrically connecting sets of interconnection points of each of the hybrid circuits.

20 Claims, 4 Drawing Sheets

(56) References Cited

OTHER PUBLICATIONS

U.S. Appl. No. 12/563,752, Advisory Action mailed Sep. 18, 2009, 3 pgs.
U.S. Appl. No. 12/563,752, Non Final Office Action mailed Mar. 17, 2011, 10 pgs.
U.S. Appl. No. 12/563,752, Non-Final Office Action mailed Sep. 17, 2010, 7 pgs.
U.S. Appl. No. 12/563,752, Notice of Allowance mailed Nov. 29, 2011, 7 pgs.
U.S. Appl. No. 12/563,752, Response filed Jun. 17, 2011 to Non-Final Office Action mailed Mar. 17, 2011, 7 pgs.
U.S. Appl. No. 12/563,752, Response filed Dec. 17, 2010 to Non Final Office Action mailed Sep. 17, 2010, 8 pgs.

PLANAR INTERCONNECT STRUCTURE FOR HYBRID CIRCUITS

CLAIM OF PRIORITY

This patent application is a continuation of and claims the benefit of priority under 35 U.S.C. §120 to U.S. patent application Ser. No. 12/563,752, filed Sep. 21, 2009, which is a divisional of U.S. patent application Ser. No. 11/743,644, filed May 2, 2007, which is incorporated herein by reference in its entirety.

FIELD OF THE INVENTION

This patent application pertains to electronic devices and methods for their construction.

BACKGROUND

In applications where the overall size of an electronic device must be limited, such as hearing aids, hybrid circuits are used to incorporate solid-state devices with discrete components. Such circuits typically incorporate one or more integrated circuits with thick film resistors, capacitors, and contact pads on a ceramic substrate. Components are interconnected using printed conductors. Where components are placed on both sides of the substrate vias are provided. The number of devices that can be accommodated on a single substrate is limited by the size of the components and the need to isolate signal paths from one another. In some cases multiple hybrid substrates must be interconnected to provide a large enough surface area to accommodate a complete circuit.

As electronic devices are scaled to smaller dimensions, utilization of space around the die becomes critical. Due to this scaling, connections from stacked die to die create design and manufacturing challenges. Interconnect techniques are needed that provide a greater number of interconnects, thereby providing hybrid manufacturers the opportunity to produce smaller and more powerful packages. The increased number of interconnects could be potentially used to add more functionality to the circuit or reduction of the final package size.

SUMMARY

Described herein is an electronic device in which one or more planar interconnect structures are interposed between two substrates each incorporating a hybrid circuit. The planar interconnect structure has a plurality of conductive traces formed on one of its faces for electrically connecting sets of interconnection points of each of the hybrid circuits.

This Summary is an overview of some of the teachings of the present application and not intended to be an exclusive or exhaustive treatment of the present subject matter. Further details about the present subject matter are found in the detailed description and appended claims. The scope of the present invention is defined by the appended claims and their legal equivalents.

DETAILED DESCRIPTION

The following detailed description of the present subject matter refers to subject matter in the accompanying drawings which show, by way of illustration, specific aspects and embodiments in which the present subject matter may be practiced. These embodiments are described in sufficient detail to enable those skilled in the art to practice the present subject matter. References to "an", "one", or "various" embodiments in this disclosure are not necessarily to the same embodiment, and such references contemplate more than one embodiment. The following detailed description is demonstrative and not to be taken in a limiting sense. The scope of the present subject matter is defined by the appended claims, along with the full scope of legal equivalents to which such claims are entitled.

Figure 1:
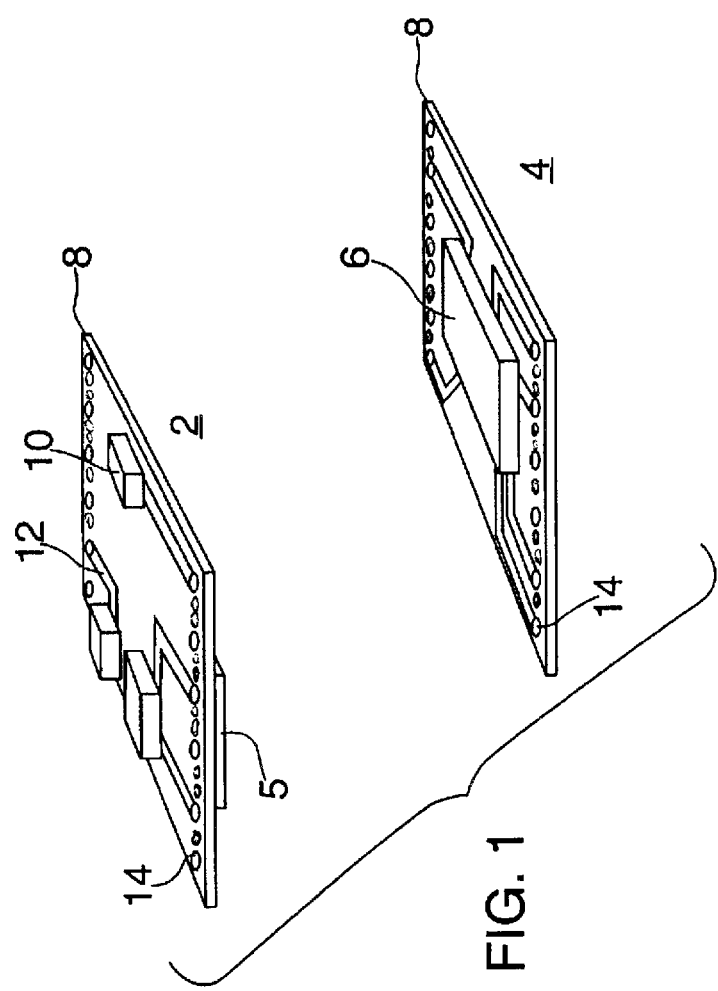
FIG. 1 shows two thick-film hybrid circuits according to one embodiment.

FIG. 1 shows two exemplary hybrid circuit components 2 and 4. The hybrid component 2 includes an integrated circuit chip 5 affixed to one surface of a substrate 8. The substrate 8 may be made of ceramic, FR4, or other suitable material. On the opposite surface of the substrate 8 are affixed thick-film hybrid circuit elements 10 and conductors 12. Along the edge of the substrate 8 are conductive vias 14 that connect the two surfaces of the substrate 8 electrically. Conductors (not shown) on the lower surface of the substrate 8 connect the integrated circuit 5 with the thick-film hybrid elements 10 and conductors 12 through the vias 14. Hybrid circuit component 4 is constructed in a similar manner as component 2. Vias 14 on component 4 are positioned to align with vias 14 on component 2 when the circuits are aligned face-to-face. The electrical circuits formed on the hybrid components 2, 4 when electrical connections are formed between aligned vias 14 may then constitute an operational electronic device. In other embodiments, the operational component may include three or more hybrid circuit components such as components 2 and 4 stacked together in a similar manner.

In order to connect the aligned vias 14 of two opposing hybrid components as described above, an interconnection structure may be interposed between the two opposing hybrid components, which interconnection structure provides conductive paths between pads formed on the vias 14 of the two components, the pads serving as sets of interconnection points. One example of such an interconnection structure is described in U.S. Pat. No. 5,825,631 (the '631 patent), hereby incorporated by reference. The '631 patent describes a ceramic interconnect block having through-holes that are filled with conductive material. The through-holes are spaced along the block to align with the pads formed on the vias of the two opposing hybrid components. It is difficult, however, to form through-holes in a ceramic block with a small enough diameter to allow the fine pitch necessary to meet the interconnection requirements of high-density hybrid circuits.

Figure 2A:
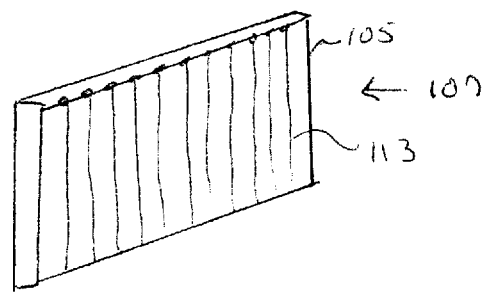
FIGS. 2A and 2B each show a planar interconnect structure used with the hybrid circuits shown in FIG. 1.
Figure 2B:
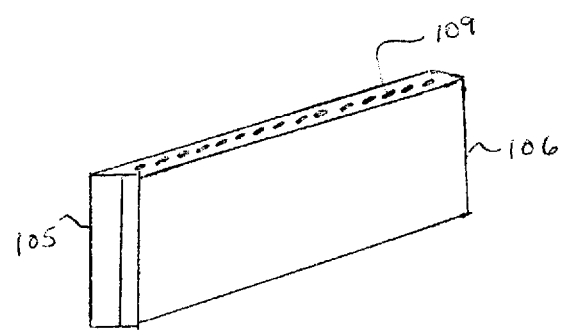

Described herein is an improved interconnection structure that allows a tighter pitch for the conductors that connect the vias of opposing hybrid circuit components than allowed by the interconnection block described in the '631 patent. Such an improved interconnection structure includes a planar section of substrate material such as ceramic or FR4, preferably the latter. An exemplary planar interconnect structure 107 is illustrated in FIG. 2A. On one face of a planar section 105 of substrate material, a plurality of conductive traces 113 are formed that traverse from one edge of the section to the other. The ends 109 of the conductive traces 113 at each edge may be used to electrically connect hybrid circuit components. Such conductive traces may be formed by coating the face of the planar section with copper or other conductive material and then etching away selected portions of the coating to form the separate traces. The etching may be performed, for example, by covering the coated face of the planar structure with an acid resistant mask and then using acid to etch away portions of the coating and leave the conductive traces. In another embodiment, grooves are formed on one face of the planar section that traverse from one edge to the other. The grooves are then filled by printing a conductive material to form the conductive traces. In either of the just described embodiments, the pitch of the conductive traces may be made much finer that obtainable with drilled through-holes. After the conductive traces are formed, another planar section of substrate material 106 may be attached (e.g., with epoxy) in face-to-face relation to cover the conductive traces of planar section 105 in a sandwich type of structure as shown in FIG. 2B, which is a presently preferred embodiment. The exposed ends 109 of the conductive traces 113 at both of the opposite edges of the planar interconnect structure 107 in FIG. 2B may be electrically connected to hybrid circuit components as before. In another embodiment, an insulating coating may be applied to the face of the planar section 105 after forming of the conductive traces. In still another embodiment, the planar interconnect structure may have no covering of its conductive traces.

Figure 3:
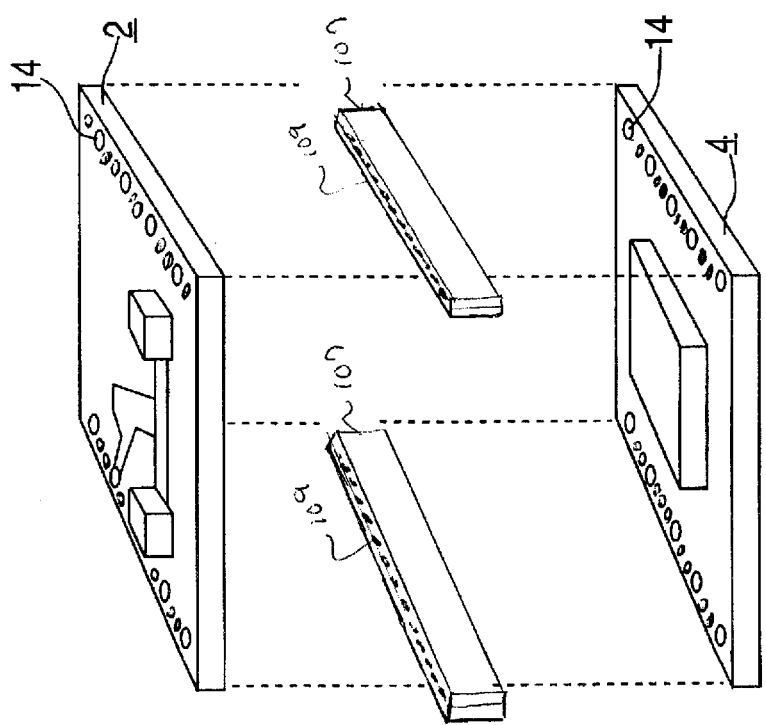
FIG. 3 shows hybrid circuits and two planar interconnect structures aligned with one another according to one embodiment.

A planar interconnect structure having a plurality of conductive traces may thus be constructed as described above. One or more such planar interconnect structures may then be used to electrically connect the vias 14 of two opposing hybrid circuit components by soldering or otherwise connecting the terminations of the conductive traces at the edges of the planar structure to the via pads on each hybrid component. The exposed ends 109 of the conductive traces 113 are spaced along the edges of the planar interconnect structure to align with pads 14 formed on the hybrid components 2, 4 as shown in FIG. 3.

In an exemplary embodiment, an electronic device includes first and second substrate. A plurality of first electronic components are disposed on at least a first side or a second side of the first substrate forming a first hybrid circuit, and a plurality of second electronic components are disposed on at least a first side or a second side of the second substrate forming a second hybrid circuit. A first set of interconnect points are disposed on the first side of the first substrate and electrically connected with the first hybrid circuit, and a second set of interconnect points are disposed on the first side of the second substrate and electrically connected with the second hybrid circuit. One or more planar interconnect structures, each having a plurality of conductive traces formed on one of its faces that traverse between two opposite edges of the planar interconnect structure leaving exposed ends of the conductive traces on the two opposite edges, are disposed between the first sides of the first and second substrates with the two opposite edges of the planar interconnect structure contacting the first sides of the first and second substrates such that the exposed ends of the conductive traces are aligned with the first and second sets of interconnection points to form conductive paths therebetween and electrically connect the first and second hybrid circuits. The exposed ends of the conductive traces may be bonded to the sets of interconnection points by means of a solder joint formed by a reflow solder technique or a conductive epoxy joint formed by a conductive epoxy attachment technique.

In one embodiment, the conductive traces of the planar interconnect structure are formed by coating a face of the planar structure with a conductive material and then etching away selected portions of the coating to form the separate conductive traces. In another embodiment, the conductive traces of the planar interconnect structure are formed by forming a plurality of grooves on a face of the planar section that traverse from one edge to the other and then filling the grooves by printing a conductive material to form the conductive traces. In another embodiment, the planar interconnect structure further comprises first and second planar sections with the face of the first planar section having the conductive traces formed thereon and with the face of the second planar section bonded to the face of the first planar section to cover the conductive traces and leave the ends of the conductive traces exposed at the opposite edges of the planar interconnect structure.

The one or more planar interconnect structures and the sets of interconnect points may be disposed toward peripheral edges of the first and second substrates to leave a space between the two substrates. The device may then have one or more of the first electronic components are disposed on the first side of the first substrate and/or one or more of the second electronic components are disposed on the first side of the second substrate, where the dimensions of the one or more planar interconnect structures are such that the space between the first and second substrates is sufficient to accommodate the first and/or second electronic components located therein. Encapsulating material may be used for filling the space between the first and second substrates and for encasing the first and second hybrid circuits and planar interconnect structures to form a monolithic component.

Figure 4:
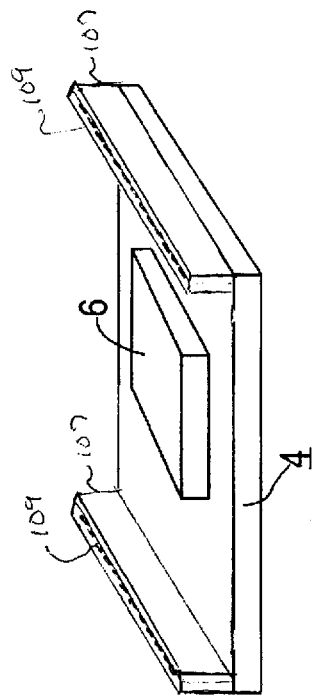
FIG. 4 shows a hybrid circuit with attached planar interconnect structures according to one embodiment.
Figure 5:
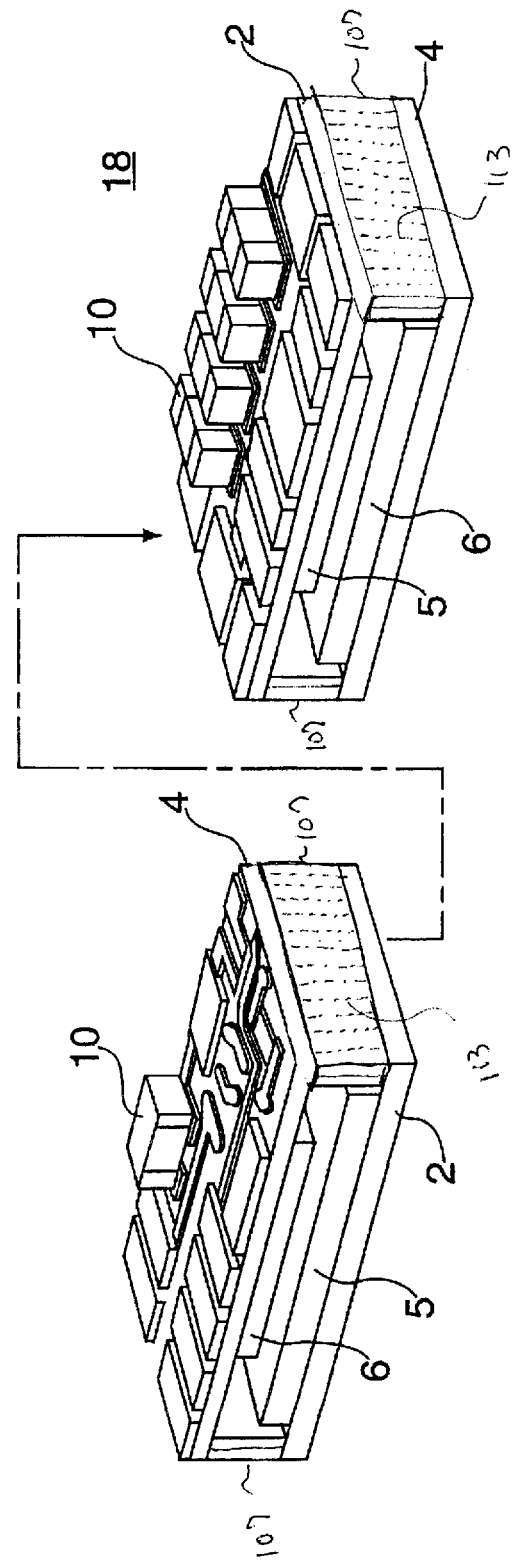
FIG. 5 shows two thick-film hybrid circuits connected to one another according to one embodiment.

FIG. 4 shows two planar interconnect structures 107 affixed to a hybrid circuit component 4. The planar interconnect structures 107 are reflow soldered to or conductive epoxied to the vias 14 using a known technique to bond the exposed ends 109 of the conductive traces 113 with the vias 14. The planar interconnect structures 107 are disposed along the edge of the substrate 8 leaving the surface of the substrate 8 substantially free to accommodate the integrated circuit chip 6. The other circuit component 2 is then aligned with the planar interconnect structures 107, as shown in FIG. 5, to form an assembly 18. Again, only the edges of circuit component 2 are covered with the planar interconnect structures 107 leaving each surface of the hybrid component 2 substantially free to accommodate an integrated circuit chip 5 and discrete components 10. The assembly 18 is again reflow soldered or conductive epoxied to bond the exposed ends of the conductive traces 113 with the vias 14 of circuit component 2. The assembly 18 may then be encapsulated with epoxy to form the completed device that can be connected with external components.

Although specific embodiments have been illustrated and described herein, this application is intended to cover adaptations or variations of the present subject matter. It is to be understood that the above description is intended to be illustrative, and not restrictive. The scope of the present subject matter should be determined with reference to the appended claims, along with the full scope of equivalents to which such claims are entitled.

What is claimed is:

1. A method for constructing an electronic device, comprising:
   providing a first substrate having disposed thereon a first electronic circuit electrically connected to a first set of interconnect points;
   providing a second substrate having disposed thereon a second electronic circuit electrically connected to a second set of interconnect points;
   forming one or more planar interconnect structures with first and second planar sections by forming one or more conductive traces on the face of the first planar section that traverse between two opposite edges of the first planar section and bonding the face of the second planar section to the face of the first planar section to cover the conductive traces and leave the ends of the conductive traces exposed at the opposite edges of the planar interconnect structure;
   disposing one or more planar interconnect structures between the first and second substrates, wherein the exposed ends of the conductive traces are aligned with the first and second sets of interconnection points to form conductive paths therebetween and electrically connect the first and second electronic circuits.

2. The method of claim 1 further comprising coating a face of the planar interconnect structure with a conductive material and then etching away selected portions of the coating to form the separate conductive traces.

3. The method of claim 2 wherein the etching is performed by covering the coated face of the planar interconnect structure with an acid resistant mask and then using acid to etch away portions of the coating and leave the conductive traces.

4. The method of claim 1 further comprising forming a plurality of grooves on a face of a planar section that traverses from one edge to the other and then filling the grooves by printing a conductive material to form the conductive traces.

5. The method of claim 1 further comprising disposing the one or more planar interconnect structures toward peripheral edges of the first and second substrates.

6. The method of claim 1 further comprising bonding the exposed ends of the conductive traces to the first and second sets of interconnection points.

7. The method of claim 6 wherein the bonding of the exposed ends of the conductive traces is performed with a solder joint formed by a reflow solder technique.

8. The method of claim 6 wherein the bonding of the exposed ends of the conductive traces is performed with a conductive epoxy joint formed by a conductive epoxy attachment technique.

9. The method of claim 1 further comprising filling the space between the first and second substrates with encapsulating material and encasing the first and second electronic circuits and planar interconnect structures to form a monolithic component.

10. The method of claim 1 wherein the first and second electronic circuits are hybrid circuits affixed to each of the first and second substrates.

11. The method of claim 1 wherein the hybrid circuits affixed to each of the first and second substrates are electrically connected to vias that form the first and second sets of interconnection points.

12. The method of claim 1 further comprising bonding the face of the second planar section to the face of the first planar section using epoxy.

13. An electronic device, comprising:
   a first substrate having disposed thereon a first electronic circuit electrically connected to a first set of interconnect points;
   a second substrate having disposed thereon a second electronic circuit electrically connected to a second set of interconnect points;
   one or more planar interconnect structures with first and second planar sections, wherein one or more conductive traces are formed on the face of the first planar section that traverse between two opposite edges of the first planar section and further wherein the face of the second planar section is bonded with epoxy to the face of the first planar section to cover the conductive traces and leave the ends of the conductive traces exposed at the opposite edges of the planar interconnect structure; and,
   wherein one or more planar interconnect structures are disposed between the first and second substrates such that the exposed ends of the conductive traces are aligned with the first and second sets of interconnection points to form conductive paths therebetween and electrically connect the first and second electronic circuits.

14. The device of claim 13 wherein the first and second electronic circuits are hybrid circuits affixed to each of the first and second substrates.

15. The device of claim 14 wherein the hybrid circuits affixed to each of the first and second substrates are electrically connected to vias that form the first and second sets of interconnection points.

16. The device of claim 13 wherein the one or more planar interconnect structures are formed by coating a face of the planar interconnect structure with a conductive material and then etching away selected portions of the coating to form the separate conductive traces.

17. The device of claim 16 wherein the etching is performed by covering the coated face of the planar interconnect structure with an acid resistant mask and then using acid to etch away portions of the coating and leave the conductive traces.

18. The device of claim 13 wherein the one or more planar interconnect structures are formed by forming a plurality of grooves on a face of a planar section that traverses from one edge to the other and then filling the grooves by printing a conductive material to form the conductive traces.

19. The device of claim 13 wherein the one or more planar interconnect structures are disposed toward peripheral edges of the first and second substrates.

20. The device of claim 13 wherein the exposed ends of the conductive traces are bonded to the first and second sets of interconnection points.

* * * * *